(12) United States Patent
Davis et al.

(10) Patent No.: US 7,444,574 B2
(45) Date of Patent: Oct. 28, 2008

(54) STIMULUS EXTRACTION AND SEQUENCE GENERATION FOR AN ELECTRIC DEVICE UNDER TEST

(75) Inventors: Maureen Terese Davis, Round Rock, TX (US); Katherine Ann Dunning, Austin, TX (US); Tony Emile Sawan, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 433 days.

(21) Appl. No.: 11/064,729

(22) Filed: Feb. 24, 2005

(65) Prior Publication Data

US 2006/0190233 A1 Aug. 24, 2006

(51) Int. Cl.
*G01R 31/28* (2006.01)

(52) U.S. Cl. .................. 714/741; 714/25; 714/31; 714/33; 714/37; 714/39; 714/724; 714/742; 703/13; 703/14; 703/15; 703/19; 716/4; 716/5; 716/6; 716/18; 717/109; 717/125; 717/134; 717/135

(58) Field of Classification Search ............ None
See application file for complete search history.

(56) References Cited

U.S. PATENT DOCUMENTS

| | | | | |
|---|---|---|---|---|
| 5,202,889 A | * | 4/1993 | Aharon et al. ............ | 714/739 |
| 5,745,386 A | * | 4/1998 | Wile et al. ............... | 703/15 |
| 6,029,262 A | * | 2/2000 | Medd et al. .............. | 714/724 |
| 6,182,258 B1 | * | 1/2001 | Hollander ................ | 714/739 |
| 6,347,388 B1 | * | 2/2002 | Hollander ................ | 714/739 |
| 6,453,450 B1 | * | 9/2002 | Walter .................... | 716/6 |
| 6,530,054 B2 | * | 3/2003 | Hollander ................ | 714/739 |
| 2002/0002698 A1 | * | 1/2002 | Hekmatpour ............. | 716/4 |
| 2004/0044976 A1 | * | 3/2004 | Schultz ................... | 716/6 |
| 2004/0153301 A1 | * | 8/2004 | Isaacs et al. ............. | 703/14 |

\* cited by examiner

*Primary Examiner*—John P Trimmings
(74) *Attorney, Agent, or Firm*—Dillon & Yudell, LLP

(57) ABSTRACT

A method and system that utilizes a graphical interface that enables a user to select and capture building blocks of a Device Under Test (DUT) test scenario from a previously run test case or from multiple stimulation results. Each of these extracted building block events or "tags" are created from a slice of a graphical stimulation view, which slice is converted into a coded stimulus written in a high-level language code that represents the condition(s) that created the graphical simulation view. These coded stimuli (representing the tags) are stored in a library. To create a corner case scenario or sequence in the DUT, a user utilizes a graphical interface to select the different extracted tags from the library and combines them together.

20 Claims, 7 Drawing Sheets

Original Simulation Results View

Stimulus Generation View

STIMULUS EXTRACTION AND SEQUENCE GENERATION FOR AN ELECTRIC DEVICE UNDER TEST

BACKGROUND OF THE INVENTION

1. Technical Field

The present invention relates in general to the field of computers, and in particular to the simulation of electronic Devices Under Test (DUT). Still more particularly, the present invention describes a graphical method of generating test sequences based on current simulation results.

2. Description of the Related Art

The product development of a System On a Chip (SOC) encompasses various levels of verification that include functional, behavioral and formally parameterized testing. Several techniques and methods are used to determine the completeness of the verification effort. One common method is to generate a comprehensive list of complex stimulus sequences that represent the various scenarios needed to validate the Design Under Test (DUT), which is a combination of the SOC hardware and a software wrapper associated with the SOC. As the complexity of the DUT grows, so does the complexity of the needed scenarios.

The traditional method of generating these complex scenarios is through manual coding, or parameterized stimulus generators. The required time to produce such design verification code can be very long, the task tedious, and error prone. In addition, there are such scenarios called corner cases, which are defined as very specific although very unusual complex DUT operating scenarios that have the property of being difficult to predict. It is difficult, if not impossible, to code in a directed test case that represents a corner case.

Another method used to hit these corner cases is random test case generation. However, such random test cases can take millions of run cycles to achieve a single corner scenario.

What is needed, then, is a method for creating complex test scenarios that does not require excessive manual coding or the use of excessive random test cases.

SUMMARY OF THE INVENTION

The present invention is thus directed to a method and system that utilizes a graphical interface that enables a user to select and capture building blocks of a Device Under Test (DUT) test scenario from a previously run test case or from multiple stimulation results. Each of these extracted building block events or "tags" are created from a slice of a graphical stimulation view, and is then converted into a coded stimulus written in a high-level language code that represents the condition(s) that created the graphical simulation view. These coded stimuli (representing the tags) are stored in a library. To generate a corner case scenario or sequence in the DUT, a user utilizes a graphical interface to select the different extracted tags from the library and combines them together.

The present invention improves upon prior-art method for creating test case stimuli by reducing the man-hours and the machine cycle time needed to create corner case scenarios, and improves verification coverage for the DUT, particularly in the area of multiprocessor (MP) and cache coherency where many corner cases are never simulated under test conditions. Generating scenarios using visual inspection of the stimulation results is less tedious, and can provide a more logically accurate scenario than manually coding it.

The above, as well as additional purposes, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

DETAILED DESCRIPTION OF THE PREFERRED EMBODIMENT

Figure 1:
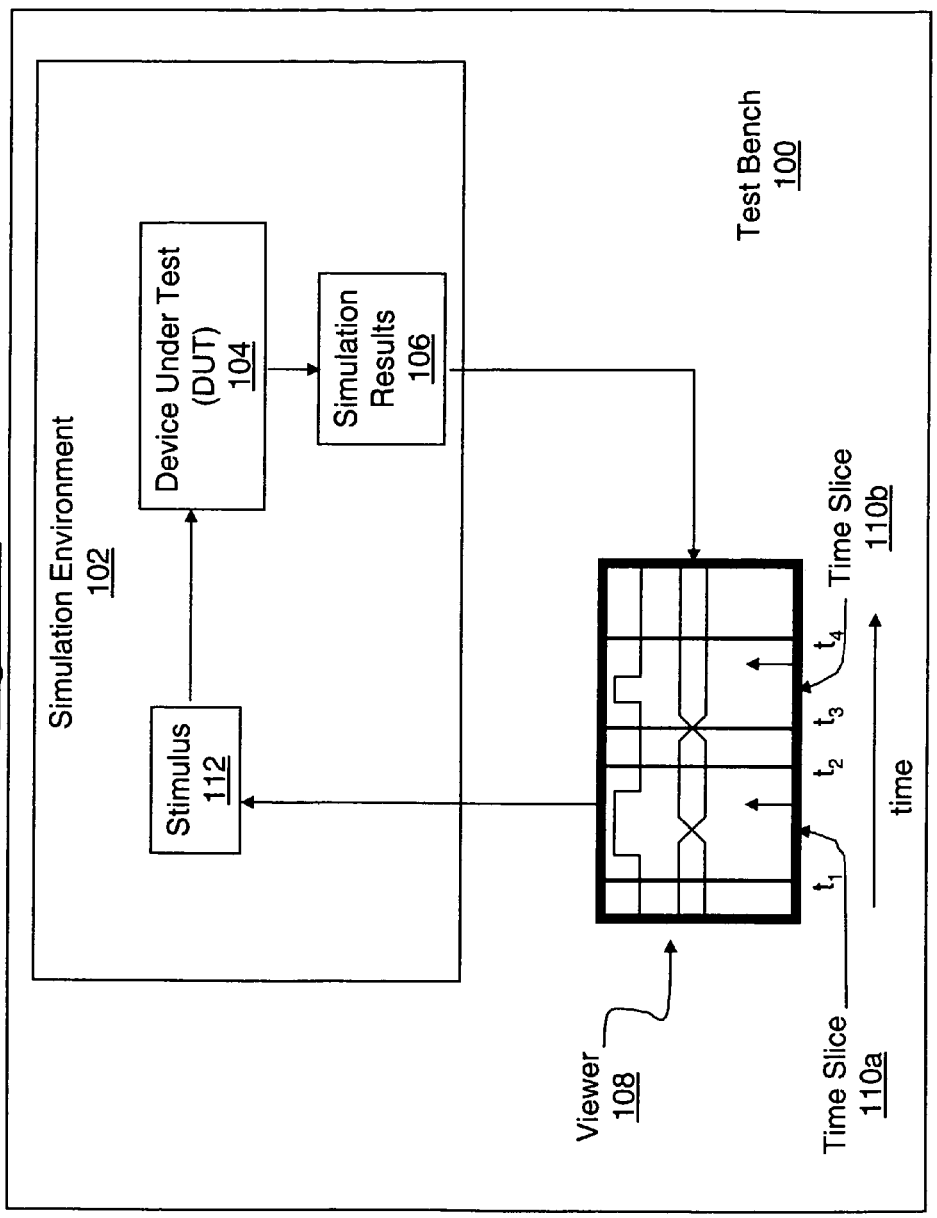
FIG. 1 depicts a test bench environment in which the present invention is utilized.

With reference now to the figures, and particularly to FIG. 1, a test bench 100 is presented. Test bench 100 includes a simulation environment 102, which includes a Device Under Test 104, which is a combination of hardware (real or simulated) and a test software environment associated with that hardware.

DUT 104 outputs simulation results 106, which are a "snapshot" of logical signals within DUT 104 (or alternatively, may be an output from DUT 104). Simulation results 106 are viewable on a viewer 108, which displays simulation results 106 along a time line, or events schedule.

The present invention includes selecting one or more time slices 110 representing events during particular time period. For example, time slice 110a captures events between times $t_1$ and $t_2$, while time slice 110b captures events between times $t_3$ and $t_4$.

One or more of the time slices 110 are then introduced as stimulus 112 into DUT 104, in a manner described in further detail below.

Figure 2:
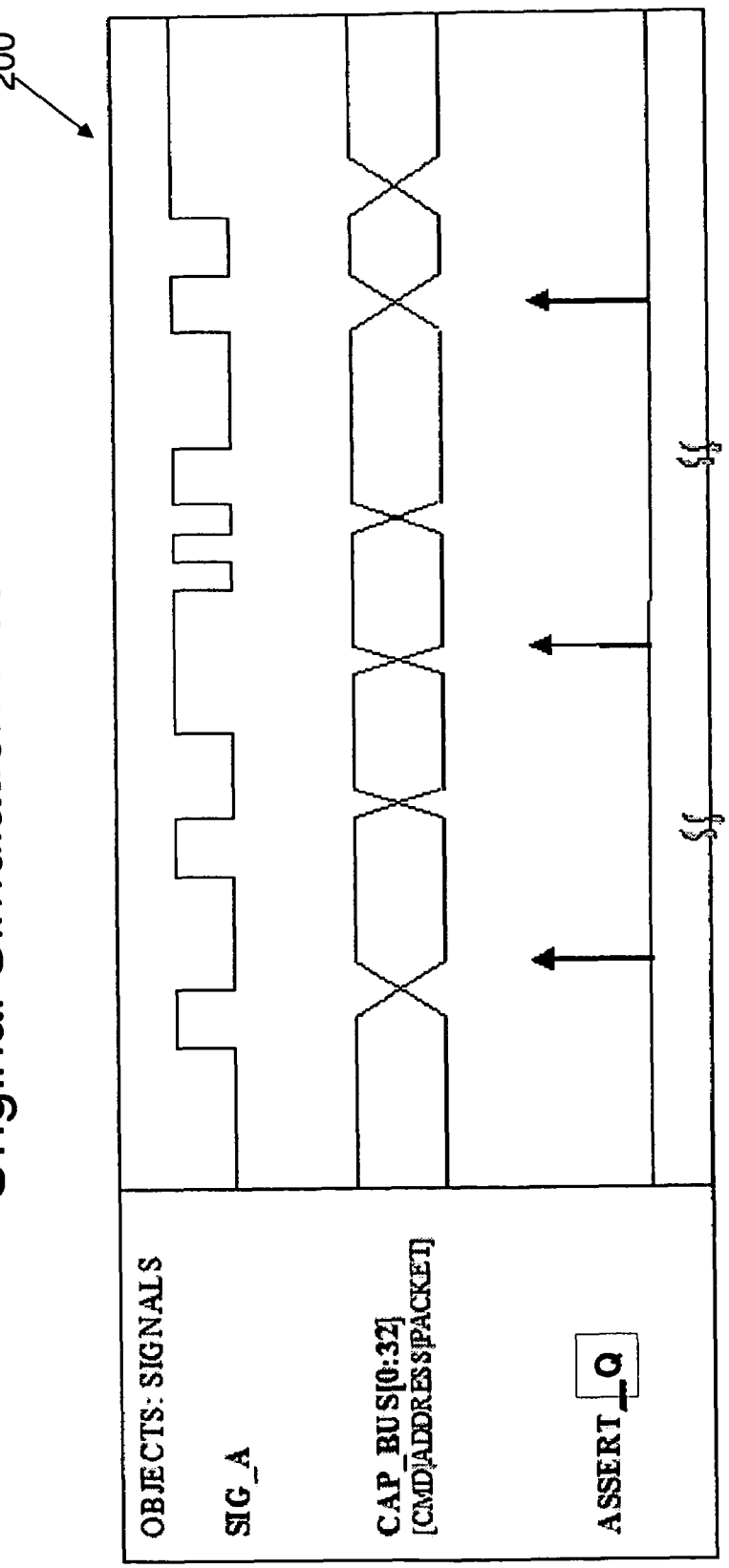
FIG. 2 depicts an original stimulation results view of signals created in a Device Under Test (DUT)

With reference now to FIG. 2, an original simulation results view 200 is shown. Original simulation results view 200 represents signals in DUT 104. Preferably, the signals represented are internal logical signals within DUT 104, although they may be input signals to or output signals from DUT 104. Original simulation results view 200 thus shows results that have been produced in or by DUT 104, either in real hardware or by a simulation, which results are examined via a waveform viewer such as viewer 108 shown in FIG. 1. The exemplary signals chosen and shown are SIG_A, CAP_BUS[0:32], and ASSERT_Q. SIG_A may be an input or an internal signal, such as from a signal checker (not shown) or a driven input, into DUT 104. CAP_BUS[0:32] is a signal on a Command Address Packet (CAP) 32-bit bus, and may represent an input, an output, or an address. ASSERT_Q is typically a logical flag, which is a conditional input identifying a logical condition.

Figure 3:
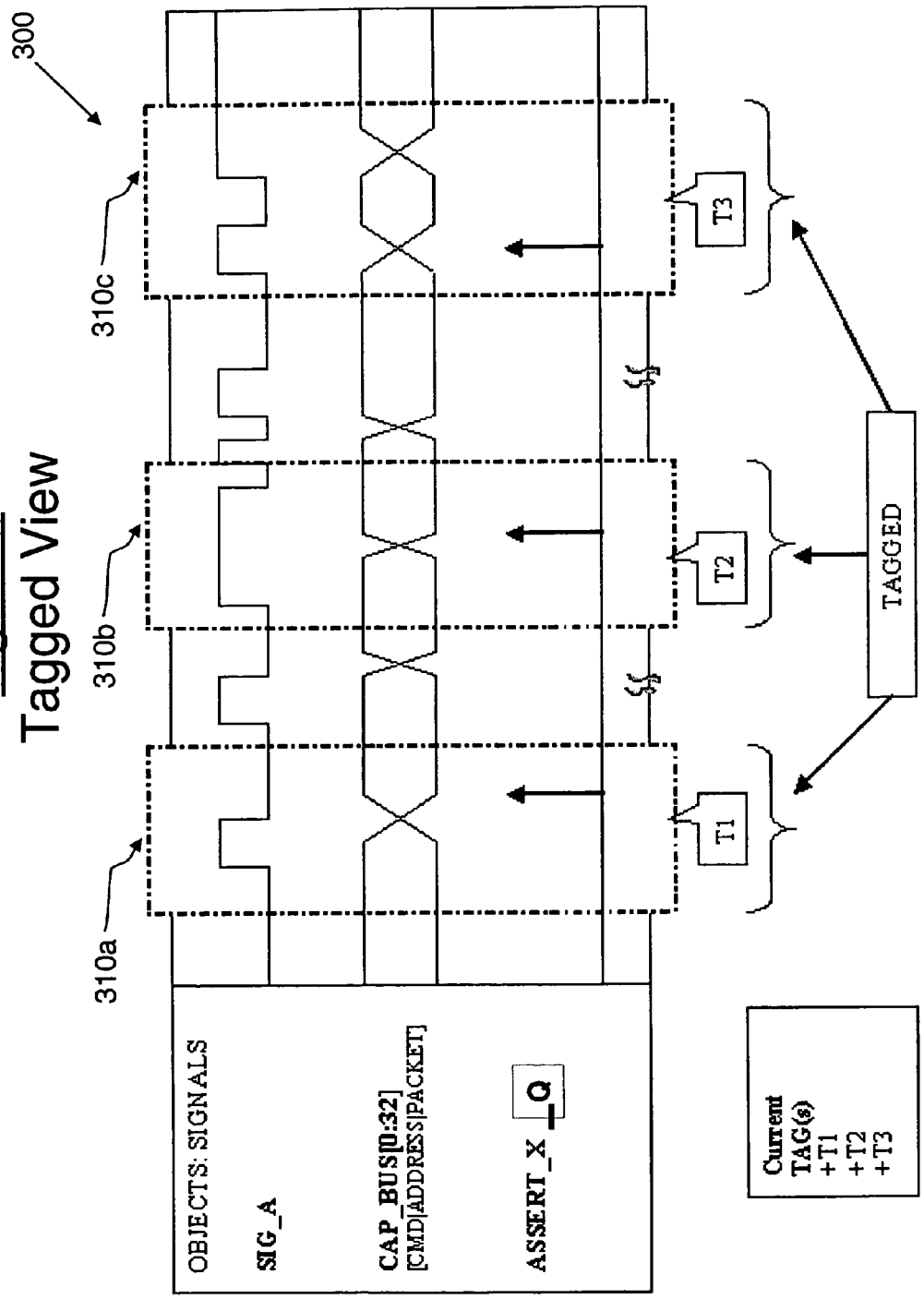
FIG. 3 illustrates a time-slice of stimulation results shown in FIG. 2.

Referring now to FIG. 3, a tagged view 300 shows multiple time windows 310a-c, which have respectively been tagged at T1, T2 and T3. These tags constitute the windows to be extracted, and encompass particular events such as T1.EV1-

T1.EV3; T2.EV1-T2.EV3; and T3.EV1-T3.EV5, shown in the extracted view of FIG. 4. Each of the tagged windows is arranged in a particular sequence (e.g., T1 followed by T2 followed by T3). However, in a preferred alternate embodiment described below, these sequences can be re-ordered to create new scenarios.

Figure 4:
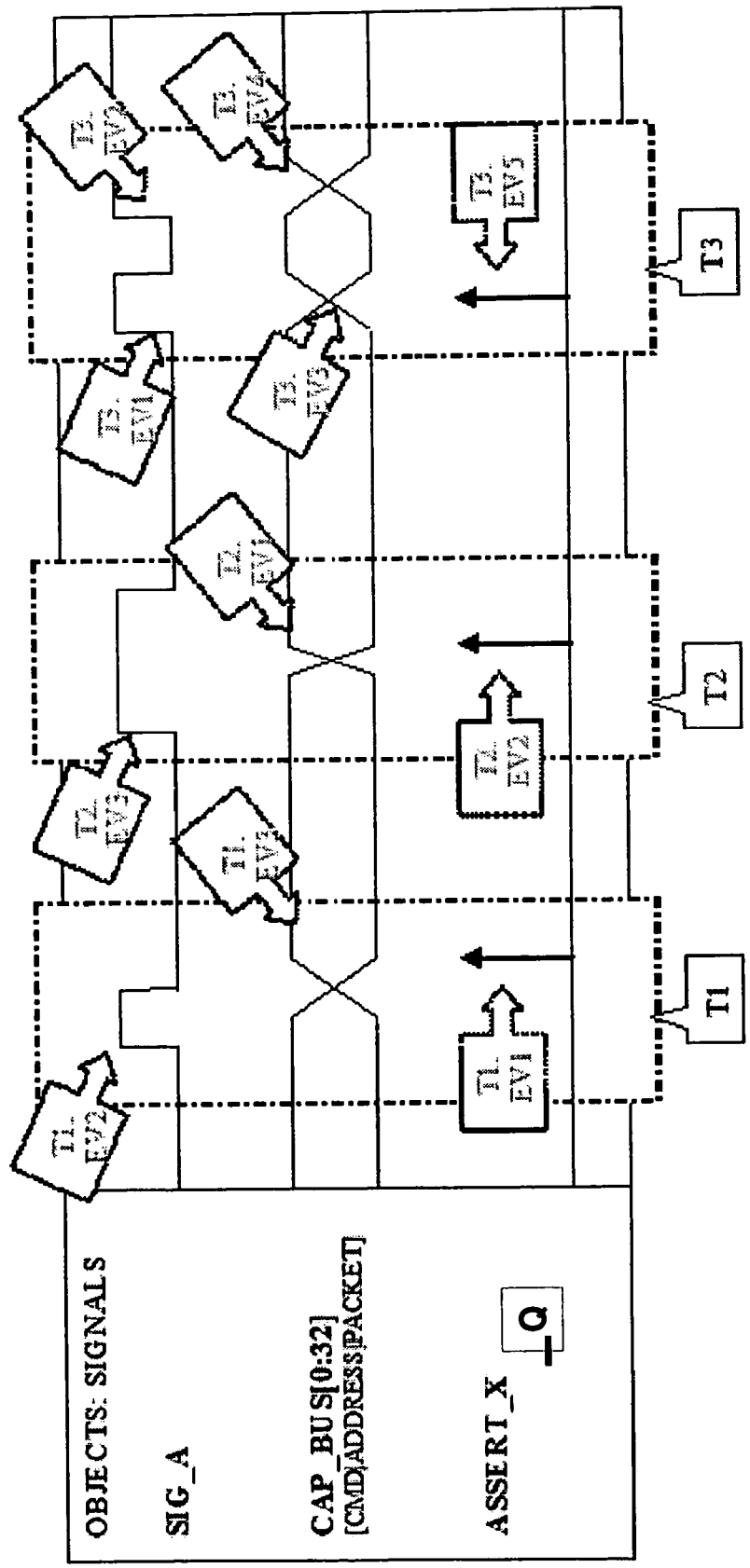
FIG. 4 depicts different events within each time-slice shown in FIG. 3.

Note that in FIG. 4, the event number does not necessary correspond to a time sequence. For example, in time window 310a (T1), event T1.EV1 occurs after event T1.EV2 and event T1.EV3. These events are seemingly randomly named to emphasize an embodiment of the present invention in which individual events can be "cherry picked" out of a particular time window 310, as opposed to an entire time window 310 representing a grouped set of events.

Figure 5:
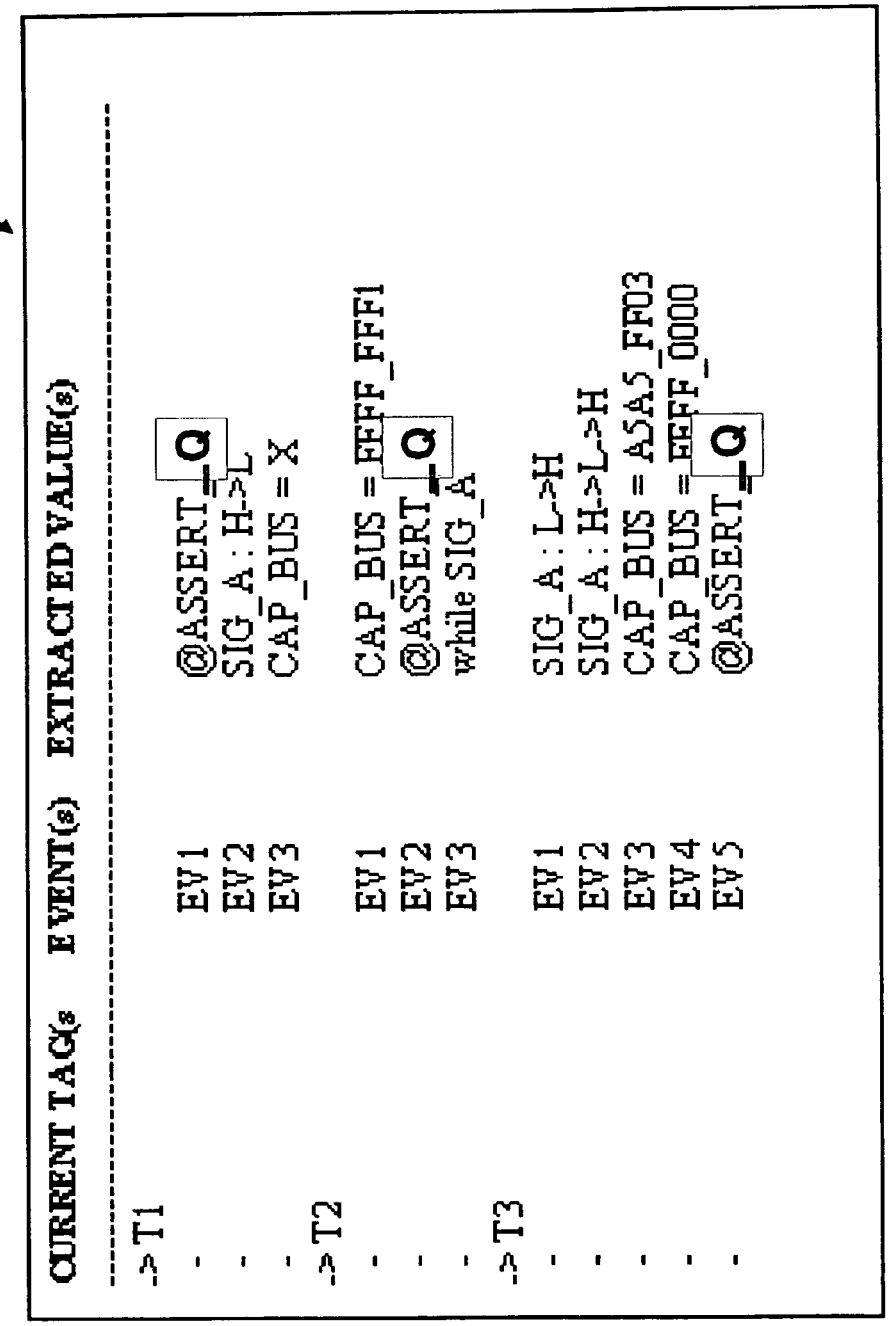
FIG. 5 is a written description of the events graphically shown in FIG. 4.

Once a sequence of tags is extracted, as shown in FIG. 4, particular events are automatically categorized as shown in FIG. 5, which represents an event capture view 500. Each event is a basic building block in a tag (time window). In one preferred embodiment, as indicated above, multiple events are grouped together to generate an elaborate sequence, which is used to generate a particular verification scenario.

Referring again to FIG. 5, consider the events in T1. Event T1.EV1 is an assertion of Q, as graphically depicted in FIG. 4. Event T1.EV2 is a generation of a Signal A representing that a logical signal has gone from High to Low. Event T1.EV3 indicates that tag T1 drives the value on the CAP bus to an unknown state.

Likewise, in T2, event T2.EV2 shows that ASSERT_Q is asserted while the value on the CAP bus is FFFF_FFF1 (T2.EV2) only if Signal A is High (T2.EV3). In T3, if Signal A is going from Low to High (T3.EV1) or Signal A is going from High to Low to High (T3.EV2), and if the value of the CAP bus is FFFF_0000 (T3.EV4), then ASSERT_Q is asserted (T3.EV5). However, if the value of the CAP bus is A5A5_FF03 (T3.EV3) or some other non-FFFF_0000 value, then the ASSERT_Q is not asserted.

Figure 6:
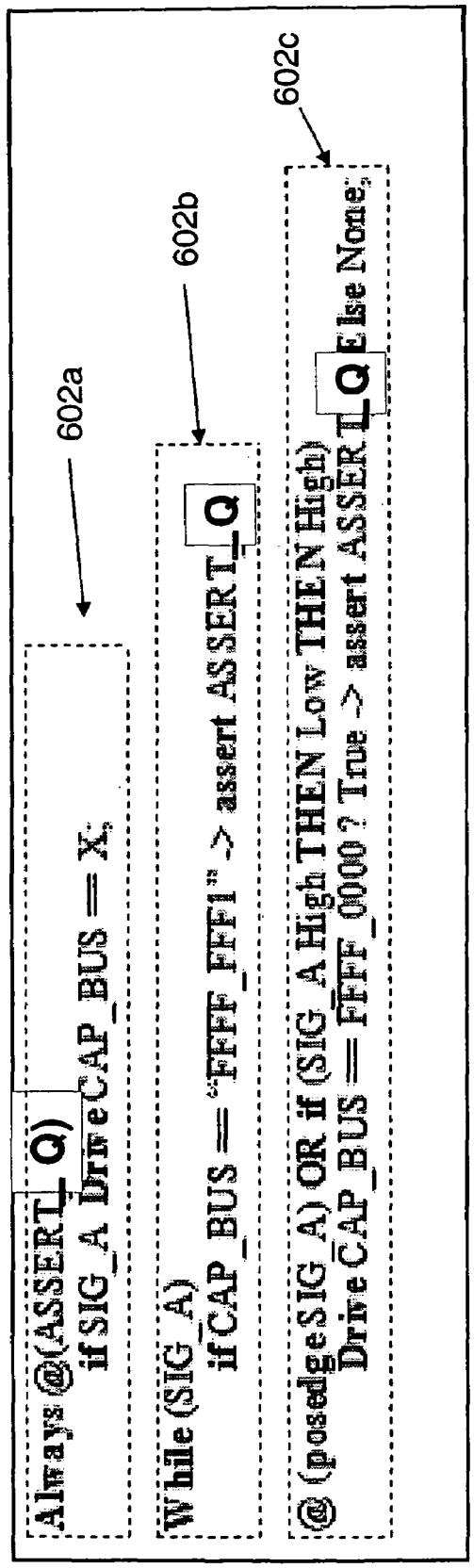
FIG. 6 shows the written description of FIG. 5 described in a high-level computer language.

The conditions for asserting ASSERT_Q are shown in a high-level language pseudo code shown in FIG. 6, which depicts a stimulus generation view 600. Exemplary high-level languages that may be used include any Hardware Descriptor Language (HDL) such as Register Transfer Language (RTL), or any other high-level language such as C, etc. Preferably, the pseudo code is grouped together as a DUT stimulus 602, to reflect event conditions shown in respective tags (event windows 310). These DUT stimuli 602 can be applied to the DUT as new stimuli in subsequent test iterations.

Figure 7:
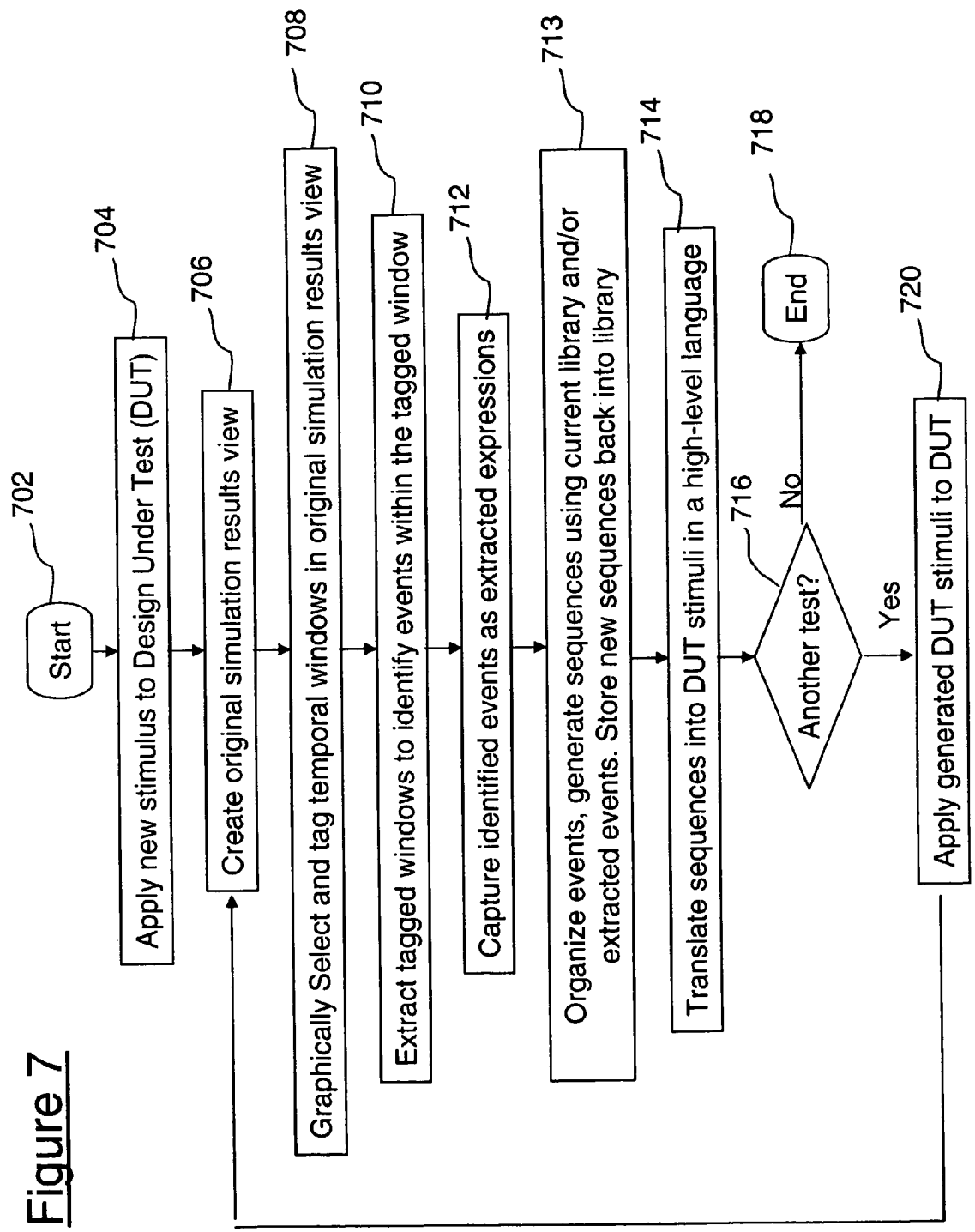
FIG. 7 is a flow-chart of steps taken in a preferred embodiment of the present invention.

The present invention is thus summarized in the flowchart shown in FIG. 7. After initiator block 702, a new stimulus is applied to the Device Under Test (block 704), such as depicted as DUT 104 in FIG. 1. An original simulation results view, such as shown in FIG. 2, is then created (block 706). Time based windows are then selected and tagged (block 708), as described in FIG. 3. The tagged windows are extracted to identify events within the selected time frames (block 710), as shown in FIG. 4. The identified events are captured as extracted expressions (block 712), as shown and described in exemplary form as "Extracted Expressions" above in FIG. 5. The expressions are then stored into a library.

As stated in block 713, the extracted expressions may be organized and/or re-arranged in any order that the test engineer desires. For example, a compilation of expressions may include those shown and described above in Tags T1, T2 and T3. However, the temporal order of the tags may be re-arranged, such that, for example, the events described in T3 precede those in T2, etc. Therefore, many different combinations are available to create different event scenarios. These many combinations make it easier for the test engineer to create a combination that emulates a corner case as described above. The reordered sequences are stored into the expressions library for future reuse.

As further described in block 713, these extracted expressions, as well as other events from the library and/or the currently presented tagged window(s) are then organized and stored as new sequences back into the library. That is, previously captured events may be reordered and/or rearranged to describe new sequences, which may then be stored in the library for use as future DUT stimuli.

The extracted expressions and/or re-organized sequences are translated into high-level code (block 714), as shown in FIG. 6.

These translated sequences from the captured sequences, as well as other events from the library and/or the currently presented tagged window(s) are organized and stored as new sequences back into the library. That is, previously captured events may be reordered, rearranged and/or renamed to describe new sequences, which are then stored in the library for use as future DUT stimuli.

A query (query block 716) is made as to whether another DUT simulation/stimulation test is to be made. If not, the process ends (terminator block 718). If so, however, then the generated DUT stimuli are applied to the DUT (block 720), and the process re-iterates. Note that the DUT stimuli are preferably from a library of DUT stimuli code that has been generated in previous iterations.

The present invention thus presents a new and useful method of graphically and selectively time-slicing particular window(s) of simulation results for one or more particular runs. A test engineer is thus able to organize/arrange these windows of captured events, produce specific test sequences, and thus generate traditionally difficult scenarios such as corner cases.

It should be understood that at least some aspects of the present invention may alternatively be implemented in a program product. Programs defining functions on the present invention can be delivered to a data storage system or a computer system via a variety of signal-bearing media, which include, without limitation, non-writable storage media (e.g., CD-ROM), writable storage media (e.g., a floppy diskette, hard disk drive, read/write CD ROM, optical media), and communication media, such as computer and telephone networks including Ethernet. It should be understood, therefore in such signal-bearing media when carrying or encoding computer readable instructions that direct method functions in the present invention, represent alternative embodiments of the present invention. Further, it is understood that the present invention may be implemented by a system having means in the form of hardware, software, or a combination of software and hardware as described herein or their equivalent.

While the invention has been particularly shown and described with reference to a preferred embodiment, it will be understood by those skilled in the art that various changes in form and detail may be made therein without departing from the spirit and scope of the invention.

What is claimed is:

1. A method comprising:
   applying a stimulus to a Design Under Test (DUT);
   creating an original simulation results graphical view of resulting signals created by the stimulus;
   selecting and tagging one or more time-based windows in the original simulation results graphical view as tagged windows, wherein the tagged windows describe multiple temporal slices for capturing and representing events during a particular time period in the original simulation results graphical view;

extracting one or more of the tagged windows to identify one or more events within the tagged windows to selectively create extracted expressions of identified events;

categorizing each of the extracted expressions according to a specific time window, in the original simulation results graphical view, from which each of the extracted expressions were extracted, wherein the categorizing describes original temporal positions of the extracted expressions; and reordering the extracted expressions as reordered combined multiple extracted expressions to create a different event scenario for inputs to the DUT, wherein the different event scenario describes different temporal positions of the extracted expressions as compared to the original temporal positions of the extracted expressions.

2. The method of claim 1, further comprising:

capturing the identified events as extracted expressions from the extracted tagged windows.

3. The method of claim 2, wherein the captured extracted expressions are stored in a library.

4. The method of claim 3, further comprising:

combining multiple extracted expressions from the library and from tagged windows in a current graphical view to generate a corner case sequence in the DUT.

5. The method of claim 4, wherein the combined extracted expressions from the library and from the tagged windows in the current graphical view are stored in a library.

6. The method of claim 5, wherein the reordered combined multiple extracted expressions from the library and from the tagged windows in the current graphical view are translated into a high level language as translated reordered combined multiple extracted expressions.

7. The method of claim 6, wherein the translated reordered combined multiple extracted expressions from the library and from the tagged windows in the current graphical view generate a DUT stimulus that is applied to the DUT.

8. The method of claim 2, further comprising:

combining a plurality of the extracted expressions from the tagged windows to generate a corner case sequence in the DUT.

9. The method of claim 8, wherein the combined extracted expressions are stored in a library.

10. The method of claim 9, wherein the combined extracted expressions from the tagged windows are translated into a high level language.

11. The method of claim 10, wherein the translated reordered combined extracted expressions generate a DUT stimulus that is applied to the DUT.

12. The method of claim 1, wherein the extracted tagged windows are translated into a high level language.

13. The method of claim 12, wherein the translated extracted tagged windows generate a DUT stimulus that is applied to the DUT.

14. The method of claim 1, wherein the resulting signals are internal logical signals within the DUT.

15. The method of claim 14, wherein the translated extracted expressions from the tagged windows generate a DUT stimulus that is applied to the DUT.

16. The method of claim 1, wherein the resulting signals are output signals from the DUT.

17. The method of claim 16, wherein the translated multiple extracted expressions from the library and from the tagged windows in the current graphical view generate a DUT stimulus that is applied to the DUT.

18. A tangible computer-usable storage medium on which is stored a computer program, the computer program comprising:

program code for applying a stimulus to a Design Under Test (DUT);

program code for creating an original simulation results graphical view of resulting signals created by the stimulus;

program code for selecting and tagging one or more time-based windows in the original simulation results graphical view as tagged windows, wherein the tagged windows describe multiple temporal slices for capturing and representing events during a particular time period in the original simulation results graphical view;

program code for extracting one or more of the tagged windows to identify one or more events within the tagged windows to selectively create extracted expressions of identified events;

program code for categorizing each of the extracted expressions according to a specific time window, in the original simulation results graphical view, from which each of the extracted expressions were extracted, wherein the categorizing describes original temporal positions of the extracted expressions;

program code for reordering the extracted expressions as reordered combined multiple extracted expressions to create a different event scenario for inputs to the DUT, wherein the different event scenario describes different temporal positions of the extracted expressions as compared to the original temporal positions of the extracted expressions;

program code for capturing the identified events as extracted expressions;

program code for translating the extracted expressions to generate a DUT stimuli; and program code for applying the generated DUT stimuli to the DUT.

19. The tangible computer-usable storage medium of claim 18, wherein the DUT stimuli are translated into a high-level language.

20. The tangible computer-usable storage medium of claim 18, further comprising:

program code for combining a plurality of the events from the tagged windows to replicate a corner case in the DUT; and program code for applying the plurality of the events as DUT stimuli to the DUT.

* * * * *